US006534805B1

(12) United States Patent
Jin

(10) Patent No.: US 6,534,805 B1
(45) Date of Patent: Mar. 18, 2003

(54) SRAM CELL DESIGN

(75) Inventor: Bo Jin, Campbell, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/829,510

(22) Filed: Apr. 9, 2001

(51) Int. Cl.[7] .......................... H01L 27/10; H01L 21/84
(52) U.S. Cl. ...................... 257/206; 257/211; 257/369; 438/153
(58) Field of Search ................................ 257/204, 206, 257/211, 369, 390, 393; 438/152, 153, 238

(56) References Cited

U.S. PATENT DOCUMENTS

| 5,621,232 A | * | 4/1997 | Ohno ........................... 257/288 |
| 5,654,915 A | | 8/1997 | Stolmeijer et al. ........... 365/156 |
| 5,804,477 A | * | 9/1998 | Lien ............................. 438/210 |
| 6,103,579 A | * | 8/2000 | Violette ....................... 438/279 |
| 6,150,685 A | * | 11/2000 | Ashida et al. ............... 257/296 |

FOREIGN PATENT DOCUMENTS

| JP | 11-195716 | * | 7/1999 | ....... H01L/21/8244 |
| JP | 2000243858 | * | 9/2000 | ....... H01L/21/8244 |
| JP | 2001168211 | * | 6/2001 | ....... H01L/21/8244 |

OTHER PUBLICATIONS

Ueshima et al., "A 5–$\mu m^2$ Full–CMOS Cell for High–Speed SRAMs Utilizing an Optical–Proximity–Effect Correction (OPC) Technology," 1996, pp. 146–147.

Woo et al., "A High Performance 3.97 $\mu m^2$ CMOS SRAM Technology Using Self–Aligned Local Interconnect and Copper Interconnect Metallization," 2 pgs.

* cited by examiner

Primary Examiner—Mary Wilczewski
Assistant Examiner—Toniae M. Thomas
(74) Attorney, Agent, or Firm—Kevin L. Daffer; Conley, Rose & Tayon P.C.

(57) ABSTRACT

An embodiment of a memory cell includes a series of four substantially oblong parallel active regions, arranged side-by-side such that the inner active regions of the series include source/drain regions for p-channel transistors, and the outer active regions include source/drain regions for n-channel transistors. Another embodiment of the memory cell includes six transistors having gates substantially parallel to one another, where three of the gates are arranged along a first axis and the other three gates are arranged along a second axis parallel to the first axis. In another embodiment, the memory cell may include substantially oblong active regions arranged substantially in parallel with one another, with substantially oblong local interconnects arranged above and substantially perpendicular to the active regions. A method for fabricating a memory cell may include forming substantially oblong active regions within a semiconductor substrate, and forming substantially oblong local interconnects above and perpendicular to the active regions.

10 Claims, 3 Drawing Sheets

SRAM CELL DESIGN

BACKGROUND OF THE INVENTION

1. Field of the Invention

This invention relates to semiconductor memory device fabrication, and more particularly to an improved Static Random Access Memory (SRAM) cell design and method of manufacture.

2. Description of the Related Art

The proliferation of computers and other microprocessor-based devices has contributed to an increasing demand for semiconductor memory. Microprocessors are present not only in computers, but in a diverse range of products including automobiles, cellular telephones and kitchen appliances. A conventional microprocessor executes a sequence of instructions and processes information. Frequently, both the instructions and the information reside in semiconductor memory. Therefore, an increased requirement for memory has accompanied the microprocessor boom.

There are various types of semiconductor memory, including Read Only Memory (ROM) and Random Access Memory (RAM). ROM is typically used where instructions or data must not be modified, while RAM is used to store instructions or data which must not only be read, but modified. ROM is a form of non-volatile storage—i.e., the information stored in ROM persists even after power is removed from the memory. On the other hand, RAM storage is generally volatile, and must remain powered-up in order to preserve its contents.

A conventional semiconductor memory device stores information digitally, in the form of bits (i.e., binary digits). The memory is typically organized as a matrix of memory cells, each of which is capable of storing one bit. The cells of the memory matrix are accessed by wordlines and bitlines. Wordlines are typically associated with the rows of the memory matrix, and bitlines with the columns. Raising a wordline activates a given row; the bitlines are then used to read from or write to the corresponding cells in the currently active row. Memory cells are typically capable of assuming one of two voltage states (commonly described as "on" or "off"). Information is stored in the memory by setting each cell in the appropriate logic state. For example, to store a bit having the value 1 in a particular cell, one would set the state of that cell to "on;" similarly, a 0 would be stored by setting the cell to the "off" state. (Obviously, the association of "on" with 1 and "off" with 0 is arbitrary, and could be reversed.)

The two major types of semiconductor RAM, Static Random Access Memory (SRAM) and Dynamic Random Access Memory (DRAM), differ in the manner by which their cells represent the state of a bit. In an SRAM, each memory cell includes transistor-based circuitry that implements a bistable latch. A bistable latch relies on transistor gain and positive (i.e. reinforcing) feedback to guarantee that it can only assume one of two states—"on" or "off." The latch is stable in either state (hence, the term "bistable"). It can be induced to change from one state to the other only through the application of an external stimulus; left undisturbed, it will remain in its original state indefinitely. This is just the sort of operation required for a memory circuit, since once a bit value has been written to the memory cell, it will be retained until it is deliberately changed.

In contrast to the SRAM, the memory cells of a DRAM employ a capacitor to store the "on"/"off" voltage state representing the bit. A transistor-based buffer drives the capacitor. The buffer quickly charges or discharges the capacitor to change the state of the memory cell, and is then disconnected. Ideally, the capacitor then holds the charge placed on it by the buffer and retains the stored voltage level.

DRAMs have at least two drawbacks compared to SRAMs. The first of these is that leakage currents within the semiconductor memory are unavoidable, and act to limit the length of time the memory cell capacitors can hold their charge. Consequently, DRAMs typically require a periodic refresh cycle to restore sagging capacitor voltage levels. Otherwise, the capacitive memory cells would not maintain their contents. Secondly, changing the state of a DRAM memory cell requires charging or discharging the cell capacitor. The time required to do this depends on the amount of current the transistor-based buffer can source or sink, but generally cannot be done as quickly as a bistable latch can change state. Therefore, DRAMs are typically slower than SRAMs. DRAMs offset these disadvantages by offering higher memory cell densities, since the capacitive memory cells are intrinsically smaller than the transistor-based cells of an SRAM.

As microprocessors have become more sophisticated, greater capacity and speed are demanded from the associated memory. SRAMs are widely used in applications where speed is of primary importance, such as cache memory supporting the Central Processing Unit (CPU) in a personal computer. Like most semiconductor devices, SRAMs are fabricated en masse on semiconductor wafers.

Fabrication of a metal-oxide-semiconductor (MOS) integrated circuit involves numerous processing steps. A gate dielectric, typically formed from silicon dioxide ("oxide"), is formed on a semiconductor substrate which is doped with either n-type or p-type impurities. Conductive regions and layers of the device may be isolated from one another by an interlevel dielectric. For each MOS field effect transistor (MOSFET) being formed, a gate conductor is formed over the gate dielectric, and dopant impurities are introduced into the substrate to form a source and drain. Frequently, the integrated circuit will employ a conducting layer to provide a local interconnect function as well. A pervasive trend in modern integrated circuit manufacture is to produce transistors that are as fast as possible and thus have feature sizes as small as possible. Many modern day processes employ features, such as gate conductors and interconnects, which have less than 1.0 $\mu$m critical dimension. As feature size decreases, the sizes of the resulting transistor and the interconnect between transistors also decrease. Fabrication of smaller transistors allows more transistors to be placed on a single monolithic substrate, thereby allowing relatively large circuit systems to be incorporated on a single, relatively small die area.

However, integrated circuits become increasingly difficult to manufacture as their dimensions are reduced. Integrated circuits with complex geometries may be particularly difficult to manufacture as dimensions are reduced. Consequently, integrated circuit designs without complex geometries are preferable. Further, reducing the number of steps in an integrated circuit's manufacturing process flow is desired. Reducing the number of processing steps often results in higher profits. Clearly, it would be desirable to have an improved circuit design and method of manufacture to facilitate fabrication of smaller and faster SRAMS.

SUMMARY OF THE INVENTION

The problems outlined above may be addressed by an improved circuit design and method of fabrication disclosed herein for an integrated circuit, specifically a semiconductor memory device. In the embodiments considered herein, the semiconductor memory device is a static random access memory (SRAM) device, but it is believed that principles disclosed herein are applicable to other types of integrated circuits as well. For example, any device requiring local interconnection of multiple active regions and gates may be suitable.

A memory cell is disclosed herein including a series of four substantially oblong parallel active regions. The active regions are arranged such that the inner active regions comprise source/drain regions for p-channel transistors, while the outer active regions comprise source/drain regions for n-channel transistors. Substantially oblong polysilicon structures may be arranged above and substantially perpendicular to the active regions. Substantially oblong local interconnects may also be arranged above and substantially perpendicular to the active regions. Each active region may include source/drain regions for no more than two transistors. Source/drain contacts to the source/drain regions of the transistors may include at least one shared contact, such that the shared contact is connected to a polysilicon structure as well as an inner source/drain region. A shared contact may be connected to a source/drain contact using a local interconnect. In an embodiment, the local interconnect is dielectrically spaced above the substrate. In an alternate embodiment, the local interconnect may have an upper surface substantially commensurate with the upper surface of at least one respective contact.

A memory cell including six transistors with gates that are substantially parallel to one another is also disclosed. Three of the gates are arranged along a first axis, and the other three are arranged along a second axis parallel to the first axis. Two of the gates along an axis may be arranged within a single polysilicon structure. Of these two, one may be a gate for a p-channel transistor and the other may be a gate for an n-channel transistor. The third gate along an axis may be arranged within another polysilicon structure. This second polysilicon structure may be electrically coupled to a respective local wordline. Each of the two local wordlines may be electrically coupled to a global wordline, which in an embodiment comprises metal. Also included in the memory cell may be a shared contact arranged between the axes and in contact with a source/drain region of a p-channel transistor along one axis and a polysilicon structure along the other axis. In an embodiment, the memory cell may also include an active region substantially perpendicular to the axes and electrically coupled to a bitline where the bitline extends across the entire length of the memory cell. The bitline may be substantially parallel to the active region, and the length of the bitline may be less than a third of the width of the cell.

In an embodiment, a memory cell is disclosed having substantially oblong active regions arranged substantially in parallel with one another within a semiconductor substrate. The memory cell also has multiple local interconnects arranged above and substantially perpendicular to the active regions, where the interconnects are also substantially oblong and in parallel with one another. In an embodiment, the memory cell may also include substantially square local interconnects such that all interconnects are either substantially oblong or substantially square. In an embodiment, the memory cell may also include a shared contact that is electrically coupled to an active region and a polysilicon structure abutting said active region.

Also disclosed herein is a method of fabricating a memory cell including forming substantially oblong active regions arranged substantially in parallel with one another within a semiconductor substrate. The method also includes forming substantially oblong local interconnects arranged above the semiconductor substrate where the interconnects are substantially in parallel with one another and substantially perpendicular to the active regions. In an embodiment, forming the local interconnects may include etching a trench through a dielectric material and depositing a conductive material into the trench. The method may include forming substantially oblong polysilicon structures arranged above the semiconductor substrate where the polysilicon structures are substantially in parallel with one another and substantially perpendicular to the active regions. Forming the polysilicon structures may include forming an access polysilicon structure for each of two access transistor gates within the memory cell, where the access polysilicon structures do not extend across the entire memory cell. In an embodiment, forming the memory cell may include forming a global wordline, where the wordline is dielectrically spaced above the active regions and where the wordline is electrically coupled to the access polysilicon structures.

The improved circuit design and method of fabrication disclosed herein may provide numerous advantages. This circuit design may be improved because the memory cell layout may allow the features to be arranged in such a way as to minimize cell size. Another advantage of the improved circuit design is the substantially parallel features that reduce manufacturing complexities, particularly in photolithography. As a result of the substantially parallel layout, reducing feature sizes to increase device speeds and/or to minimize memory cell size may be facilitated. In addition, the substantially parallel layout may change the aspect ratio of the memory cell such that the bitlines may be reduced in length, thus advantageously decreasing bitline resistivity and increasing memory cell performance. Furthermore, this circuit design may be improved because of the symmetrical the layout design, which may improve noise margins. Yet another advantage of the improved circuit design is the elimination of polysilicon wordlines that traverse the entirety of the memory cell. Elimination of such polysilicon wordlines may minimize cell size by reducing the density of features required on the polysilicon layer of the cell. Reducing the amount of polysilicon in the wordlines may also result in increased use of a metal layer to perform the wordline function, thus advantageously decreasing wordline resistivity and increasing memory cell performance. A further advantage of the improved circuit design is that the improved polysilicon layer may partially perform local interconnecting functions. Therefore, the subsequent local interconnect layer may be greatly simplified and the local interconnects may also be arranged substantially in parallel. The improved layout may further enable the use of a trench local interconnect layer, thus reducing the number of processing steps.

BRIEF DESCRIPTION OF THE DRAWINGS

Other objects and advantages of the invention will become apparent upon reading the following detailed description and upon reference to the accompanying drawings in which.

Figure 1:
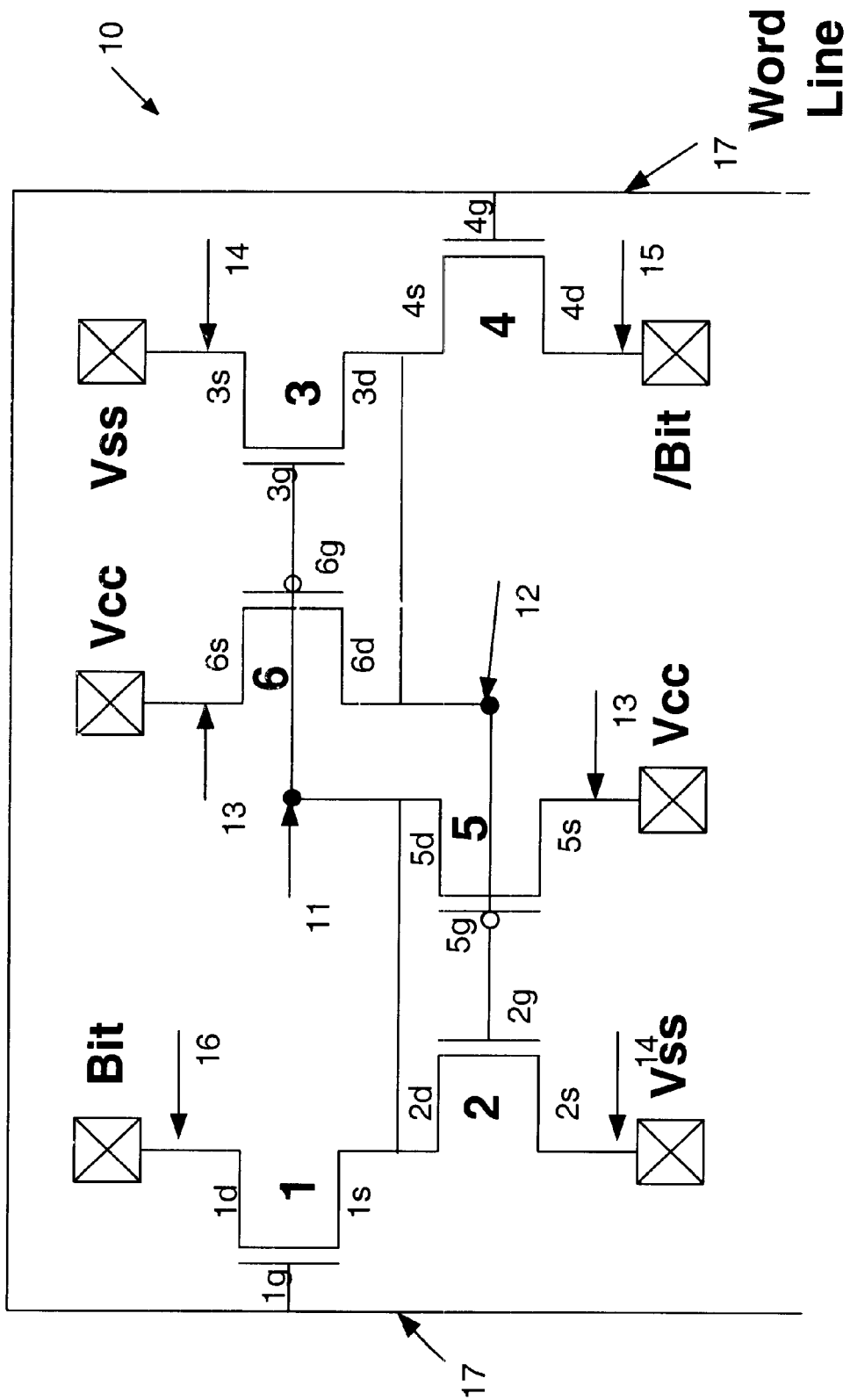
FIG. 1 shows the transistor configuration of an embodiment of an improved SRAM memory cell.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

A circuit diagram for an improved double wordline SRAM memory cell is shown in FIG. 1. Generally stated, SRAM memory cells may be formed by interconnecting two CMOS inverters together so that the input of a first inverter is tied to the output of a second inverter and vice versa to form a positive feedback orientation. Such configuration of two inverters is commonly referred to as a bi-stable latch as described above. The inverters include transistors commonly referred to as latch transistors. In the embodiment of FIG. 1, transistors 2 and 5 form the first inverter, transistors 3 and 6 form the second inverter, the node representing the input of the first inverter is labeled 12, and the node representing the input of the second inverter is labeled 11. Thus, the memory cell 10 comprises four latch transistors 2, 3, 5, and 6 and two access transistors 1 and 4, each of which has a drain, source and gate. The latch transistors 2, 3, 5, and 6 include a pair of n-channel pull-down transistors 2 and 3 and a pair of p-channel load transistors 5 and 6.

The inverters are connected as follows to form the bi-stable latch of FIG. 1. A drain 2d of pull-down transistor 2 is coupled to a drain 5d of load transistor 5 at node 11 and a drain 3d of a pull-down transistor 3 is coupled to a drain 6d of load transistor 6 at node 12. These nodes 11 and 12 store opposite logic states (i.e., one is a logic "1" while the other is a logic "0"). Sources 5s and 6s of transistors 5 and 6 are coupled to a common power line 13 (hereinafter referred to as a "Vcc line") while sources 2s and 3s of pull-down transistors 2 and 3 are coupled to a common ground line 14 (hereinafter referred to as a "Vss line"). Gates 2g and 5g of transistors 2 and 5 are coupled together and connected to the node 12 and gates 3g and 6g of transistors 3 and 6 are coupled together and connected to node 11.

Such interconnections create positive feedback, which allows the memory cell to store data as either a "high" or "low" input (i.e., a logic "1" or "0"). Data is stored in these memory cells during a "write cycle" and that data is subsequently read during a "read" cycle. The n-channel access transistors 1 and 4 are coupled to the memory cell 10 to allow communication between the cell 10 and an external device through a pair of complementary bitlines 15 and 16. With respect to the access transistors 1 and 4, each source 1s and 4s is coupled to nodes 11 and 12, respectively. A drain 1d of access transistor 1 is coupled to a bitline 16, referred to as "Bit," which operates as a data line to read data from and write data into the memory cell 10. A drain 4d of a second access transistor 4 is similarly coupled to a complementary bitline 15 called "/Bit," In addition, both gates 1g and 4g are coupled to wordline 17.

Applying a positive voltage to the wordline 17 turns on both access transistors 1 and 4, thus accessing memory cell 10. This allows one of the two bitlines 15 and 16 to sense the contents of the memory cell 10 based on the voltage at either node 11 or 12. For example, if node 11 is at a high (Vcc) voltage and node 12 is at the ground potential (Vss), when the wordline 17 is brought to a high voltage, the pull-down transistor 3 and the access transistor 4 are both turned on and will thus pull the bitline "/Bit" 15 down toward the ground potential Vss. Moreover, the load transistor 5 and the access transistor 1 are also tuned on; thus the bitline "Bit" 16 will be pulled up towards the Vcc potential. Thus the state of the cell 10 (either "1" or "0") can be determined by sensing the difference in potential between the bitlines 15 and 16.

Conversely, writing a "1" or a "0" into the cell 10 can be accomplished by forcing the bitline 15 or the bitline 16 to either Vcc or Vss and then raising the wordline 17. The potential placed on either the bitline "/Bit" 15 or the bitline "Bit" 16 will then be transferred to the node 11 or 12, respectively, forcing the cell 10 into either a corresponding "1" state or a "0" state.

Figure 2:
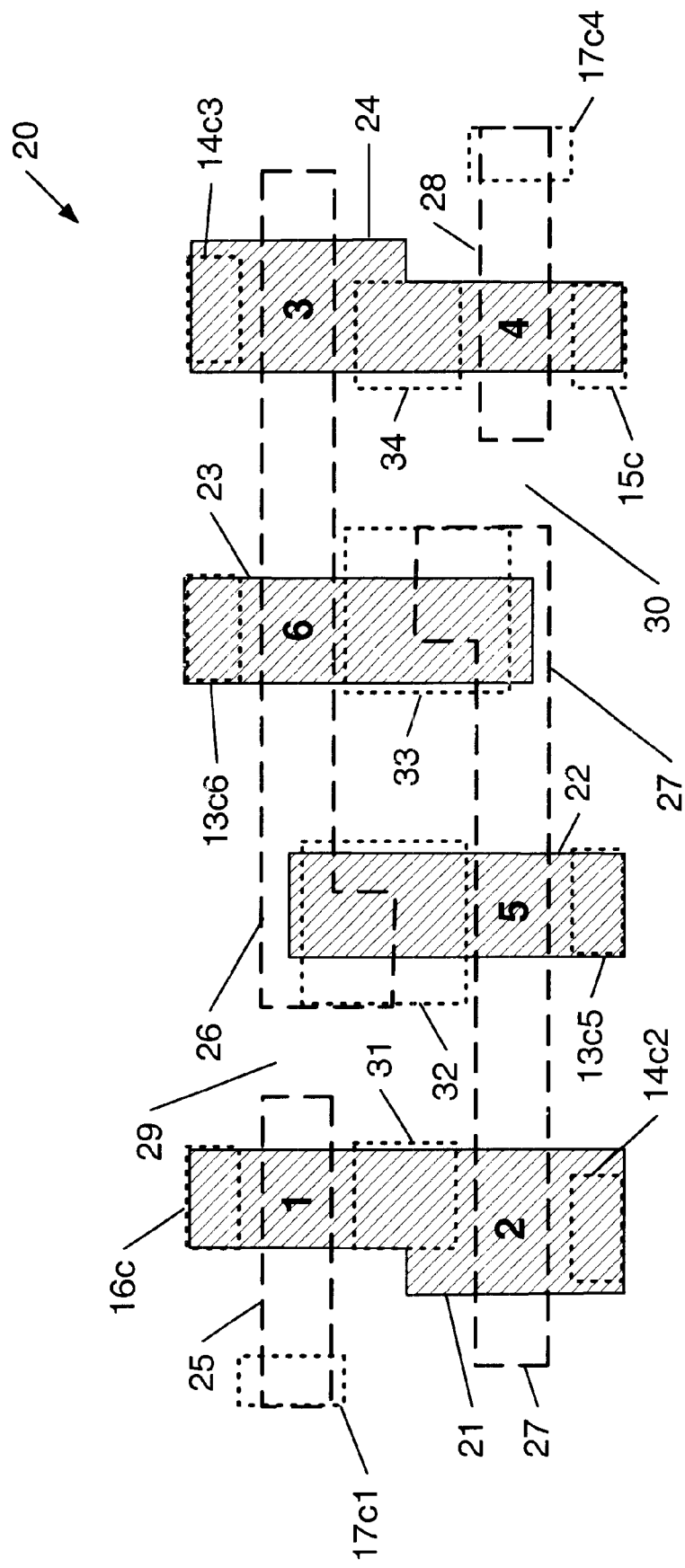
FIG. 2 represents a layout of the active regions and polysilicon structures for the embodiment of FIG. 1.

Shown in FIG. 2 is an embodiment of a layout 20 that may be used to form in silicon the memory cell 10 represented in FIG. 1. (Elements appearing in more than one figure retain the same item numbers throughout the figures.) FIG. 2 presents a top-down view of an exemplary memory cell layout 20. Layout 20 illustrates the active regions, isolation regions, polysilicon structures, and contact structures that may be used to form the typical metal oxide semiconductor (MOS) transistors, NMOS and PMOS, used in a typical CMOS SRAM. In the embodiment of FIG. 2, NMOS transistors 1–4 are formed within active regions 21 and 24, and PMOS transistors 5 and 6 are formed within active regions 22 and 23. The active regions are formed within a semiconductor substrate. The semiconductor substrate may preferably be a silicon substrate doped n-type and p-type in the vicinity of the p-channel transistors and the n-channel transistors, respectively. More specifically, the semiconductor substrate may include n-type and p-type well regions formed in a monocrystalline silicon substrate, or in an epitaxial silicon layer grown on a monocrystalline silicon substrate.

Active regions, i.e., areas where active transistors are to be formed, are labeled 21–24 and are arranged side-by-side and substantially parallel to each other. Diffusion regions are also to be formed within the active regions 21–24. For example, diffusion regions may be lightly doped drain regions and heavily doped source/drain regions formed in active regions adjacent to the transistor gate structures. Dielectric isolation regions such as 29 and 30 separate active regions from one another. Isolation regions may be formed by a number of techniques such as shallow trench isolation (STI), recessed oxide isolation (ROI), or local oxidation of silicon (LOCOS). Isolation regions may therefore be field oxide regions, which serve to isolate separate active regions on the semiconductor layer from one another.

In the embodiment of FIG. 2, NMOS active regions 21 and 24 are utilized for the formation of two transistors each, a pass transistor and a latch transistor. Polysilicon structures 25 and 27 are arranged above active region 21 to form gates of pass transistor 1 and latch transistor 2, respectively. Similarly, above active region 24, polysilicon structures 28 and 26 are arranged to form gates of pass transistor 4 and latch transistor 3, respectively. Consequently, active regions 21 and 24 each have two gate conductors arranged above them. In this embodiment, no active region has more than two gate conductors arranged above it, and therefore no active region forms more than two transistors.

In the embodiment of FIG. 2, the active regions are substantially oblong, and in some cases may be substantially rectangular as well. For example, PMOS active regions, such as active regions 22 or 23 shown in FIG. 2, may have a length that is substantially constant across the width of the region, as well as a width that is substantially constant along the length of the region. However, if an NMOS active region is forming an access transistor and a latch transistor, it may have some variation in width although the length may be substantially constant across the width of the region. For example, active regions 21 and 24 as shown in FIG. 2 are each forming access transistors 1 and 4, respectively, and latch transistors 2 and 3, respectively. By design, access transistors frequently have widths that are smaller than those of adjacent latch transistors. The active region is thus designed to ensure the stability of the SRAM. This design feature is commonly referred to as the "beta ratio." A beta ratio is defined as the width of the latch transistor divided by the width of the pass transistor. To ensure circuit stability, the beta ratio should be >1. In an embodiment, the beta ratio is approximately 1.5. Therefore, in an embodiment, the width of the access transistor is approximately ⅔ the width of the latch transistor. Consequently, an NMOS active region may be considered to be substantially oblong if the length of the region is substantially constant and if the width of the region varies by approximately ⅓ or less along the length of the region. Further, an NMOS active region may be considered to be substantially oblong if the length of the region is substantially constant and the width of the region by design varies only with the respective widths of the access and latch transistors. In an embodiment, "substantially oblong" may refer to any region or structure having a length that is greater than or equal to approximately three times its maximum width. Active regions as described above are oblong with respect to, for example, the markedly "L-shaped" regions formed in layouts for which two transistors are arranged at right angles to each other.

Each transistor includes a gate electrode formed above an active region, arranged between a pair of source/drain regions, and separated from the substrate by a relatively thin dielectric. In a preferred embodiment, gate electrodes are arranged within polysilicon structures 25–28 to form transistors 1–6 as shown in FIG. 2. The polysilicon may be deposited by, for example, using chemical vapor deposition (CVD) of silicon from a silane source. However, the gate electrodes may comprise any suitable conductive material such as polysilicon, aluminum, or copper. Therefore structures 25–28 are not limited to polysilicon. For example, the gate electrodes may include multiple layers of material, such as a doped polysilicon and a silicide. A silicide may be formed from a polysilicon layer upon which a layer of refractory metal such as cobalt or titanium has been formed. Upon heating the refractory metal, a reaction between the polysilicon and the cobalt or titanium may result in the formation of a silicide such as cobalt silicide or titanium silicide. In an embodiment, the width of the gate electrode (or channel length of the transistor) may be approximately 0.12 microns, but may also be larger or smaller depending on the transistor that is being formed.

Many SRAMs are single wordline cells, meaning that there is only one local wordline arranged within each cell. It therefore follows that a double wordline cell has two local wordlines arranged within each cell. The two local wordlines are coupled either within the cell or outside the cell. Frequently, single wordline cells and double wordline cells have some similarities. Both cells may have wordlines that are polysilicon and that extend continuously from one side of the cell to the other. However, the embodiment of FIG. 2 presents a split double wordline cell. That is, the local wordlines of the embodiment of FIG. 2 do not extend continuously from one side of the memory cell to the other. For example, polysilicon structures 25 and 28 each comprise local wordlines and each couples to global wordline 17 (not shown). However, neither polysilicon structure extends continuously from one side of the memory cell to the other. Thus, polysilicon structures 25 and 28 are coupled together and to global wordline 17 outside of cell layout 20. Polysilicon structures 25 and 28 are coupled such that they rise and fall in potential together.

The split double wordline of the embodiment of FIG. 2 may allow the memory cell size to be reduced while also improving memory cell performance. Each wordline-coupled polysilicon structure 25 and 28 may be electrically coupled to a polysilicon structure arranged within an immediately adjacent cell. However, an entire row of memory cells would not be coupled together by one or two continuous polysilicon wordlines as is frequently found in SRAM circuits. For example, a continuous conductive wordline is frequently formed when the gate electrodes are formed. Because this type of continuous wordline is eliminated in the embodiment of FIG. 2, the density of the features required by the polysilicon layer of the memory cell is reduced. Consequently, the die size required to accommodate the polysilicon layer may be reduced, and the layout of the remaining polysilicon features may be improved to provide a more manufacturable memory cell. Further, the performance of the memory cell may be improved, as memory cell addressing times may no longer be limited by the resistivity of continuous polysilicon wordlines. As noted above, split local wordline polysilicon structures 25 and 28 are each electrically coupled to the global wordline 17. Except for those areas where global wordline 17 is electrically coupled to polysilicon structures 25 and 28, global wordline 17 may be a metal dielectrically spaced from the polysilicon structures.

Conductive regions and layers of the memory cell may be isolated from one another by dielectrics. Examples of dielectrics may include silicon dioxide ($SiO_2$), tetraethylorthosilicate glass (TEOS), silicon nitride ($Si_xN_y$), silicon oxynitride ($SiO_xN_y(H_z)$), and silicon dioxide/silicon nitride/silicon dioxide (ONO). The dielectrics may be grown or may be deposited by physical deposition such as sputtering or by a variety of chemical deposition methods and chemistries such as chemical vapor deposition. Additionally, the dielectrics may be undoped or may be doped, for example with boron, phosphorus, boron and phosphorus, or fluorine, to form a doped dielectric layer such as borophosphosilicate glass (BPSG), phosphosilicate glass (PSG), and fluorinated silicate glass (FSG).

The coupling of global wordline 17 to the gates of access transistors 1 and 4 may require the use of contacts 17$c$1 and 17$c$4, respectively, as shown in FIG. 2. At various stages in the fabrication of semiconductor devices, it may be necessary to form openings in a dielectric layer to allow for contact to underlying regions or layers. Generally, an opening through a dielectric exposing a diffusion region or an opening through a dielectric layer between polysilicon and an interconnect or first metal layer is called a "contact opening" or a "contact hole." If the opening is substantially oblong, it may be referred to as a "trench." An opening in other dielectric layers such as an opening through an inter-metal dielectric layer is commonly referred to as a "via." For purposes of this disclosure, henceforth "contact opening" may be used to refer to a contact opening and/or a via. Similarly, "trench" may be used to refer to any substantially oblong contact opening and/or via. A contact opening or trench may expose a diffusion region within the silicon substrate such as a source or drain, or may expose some other layer or structure such as an underlying metallization layer, a local interconnect layer, or a gate structure. Conductive contact structures may be formed above the source/drain regions, and interconnects may overlie the contact structures and may connect neighboring contact structures. These contact structures to diffusion regions may be isolated from an adjacent gate structure by a dielectric spacer. The dielectric spacer may also isolate the gate from the diffusion region.

Contacts 17c1 and 17c4 could be used to electrically couple polysilicon structures 25 and 28, respectively, to a dielectrically spaced global wordline 17. Because global wordline 17 is dielectrically spaced, it may be metal. Metal global wordlines have significantly lower resistivity than the polysilicon global wordlines or the silicided global wordlines used in some memory cells. For example, the Rs of polysilicon is approximately 50 ohms/square and the Rs of silicide is approximately 20 ohms/square. However, metals have Rs values that are significantly smaller, for example, less than approximately 0.2 ohms/square. Consequently, metal global wordlines have significantly lower resistivities than polysilicon or silicide global wordlines. Therefore, metal global wordlines may be much longer than global wordlines of polysilicon or silicide, yet still have lower resistivities. As such, metal global wordlines may significantly reduce memory cell addressing times.

For example, in the embodiment of FIG. 2, the cell aspect ratio is approximately 1:3.5. An aspect ratio as used herein generally describes the ratio between the height and width of a semiconductor feature. In the case of the cell aspect ratio, the ratio is taken between the height of the memory cell and the width of the memory cell. That is, the memory cell of the embodiment of FIG. 2 has a width (along the wordline direction) that is approximately 3.5 times its height (along the bitline direction). Further, the global wordline traversing the memory cell of the embodiment of FIG. 2 is longer than, for example, a global wordline of a memory cell with an equivalent area and an aspect ratio of 1:1. However, despite being longer, the metal global wordline of the cell of FIG. 2 would have a lower resistance than a polysilicon or silicide global wordline of a memory cell with a 1:1 aspect ratio due to the much lower metal Rs value. Further, the bitline traversing the memory cell of the embodiment of FIG. 2 would be shorter than the bitline of a cell with an equivalent area and an aspect ratio of 1:1. Consequently, the embodiment of FIG. 2 may provide significantly faster memory cell addressing times.

A double wordline may advantageously simplify cell layout by allowing all transistor gates to be arranged substantially parallel to one another. Such arrangement may eliminate active regions that are arranged one perpendicular to another and/or continuous active regions that have 90 degree "knees." Furthermore, double wordlines may also eliminate similar arrangement of the polysilicon structures. Thus, the double wordlines may facilitate the use of substantially oblong features for the active regions and the polysilicon structures. That is, the active regions may be arranged substantially parallel to one another, and the polysilicon structures may also be arranged substantially parallel to one another. Such arrangement may facilitate the future reduction of critical dimensions(CDs) for these layers since eliminating complicated geometries aids manufacturability for the photolithography process, as discussed above.

If active regions are arranged such that complex geometries are eliminated, it follows that the isolation regions are also arranged such that complex geometries are eliminated. Elimination of complex geometries may also reduce manufacturing complexities for other manufacturing processes. For example, a shallow trench isolation process ("STI") is more robust with the elimination of complex geometries. Shallow trench isolation is primarily used for isolating active regions, and is rapidly replacing local oxidation of silicon, or LOCOS, isolation structures. STI processes do not exhibit the lateral extension of oxide into the active region of the device, known as the "bird's beak", that is common with LOCOS processes. In contrast to a LOCOS process, the STI process involves patterning the semiconductor substrate, etching shallow trenches into the substrate, filling the trenches with dielectric, and removing the dielectric from the substrate so that the remaining dielectric has an upper surface approximately commensurate with the upper surface of the semiconductor substrate. That is, the STI process results in an essentially planar upper surface. Thus, STI processes further enable the reduction of CDs for polysilicon structures. For example, photolithography processes require substantially planar upper surfaces to pattern sub-micron features due to the very small depth of focus. Thus, STI processes may enable production of smaller, and therefore faster, transistors. However, the STI process is also more robust if the geometry is not complex. As geometries continue to shrink, the STI geometry also shrinks thus making the required patterning, etching, and dielectric fill more difficult. If the STI geometry is complex, the required processing may be much more difficult. Thus, simplified STI geometries are preferred.

Turning now to FIG. 2, bitline "Bit" 16 is coupled to the drain of transistor 1 by contact 16c, while bitline "/Bit" 15 is coupled to the drain of transistor 4 by contact 15c. The sources of transistors 2 and 3 are coupled to Vss by contacts 14c2 and 14c3, respectively, while the sources of transistors 5 and 6 are coupled to Vcc by contact 13c5 and 13c6, respectively. Bitlines 15 and 16, Vcc 13, and Vss 14 are also dielectrically spaced from the polysilicon structures. The bitlines, Vss, and Vcc may be contacted to each memory cell using what is commonly referred to as the first metal layer. The "first metal layer" refers to the first conductive layer above the local interconnect layer, and may be a misnomer in those cases where the local interconnect layer utilizes a metal.

Contact regions 31–34 as shown in FIG. 2 may be used for the local interconnections of gates and drains as described in the discussion of FIG. 1 above. Many types of contacts may be used; e.g., self-aligned contacts (SAC) or shared contacts may be used. Further, contacts may be substantially rectangular or substantially square. For example, SAC may be substantially square. Contacts 31 and 34 represent openings in the dielectric that expose portions of active regions 21 and 24, respectively. In particular, contact 31 allows for a contact to the source of transistor 1 and the drain of transistor 2 and contact 34 allows for contact to the source of transistor 4 and the drain of transistor 3. Contacts 32 and 33 represent openings in the dielectric, which expose portions of active regions 22 and 23, respectively, as well as exposing portions of polysilicon structures 26 and 27, respectively. As such, contacts 32 and 33 are shared contacts. That is, contacts 32 and 33 allow for contact not only to diffusion regions, but also to polysilicon structures. For example, as shown in FIG. 2, contact 32 allows for a contact to the drain of transistor 5, but it also allows for a contact to the gates of transistors 3 and 6 via polysilicon structure 26. Polysilicon structure 26 is connected to the gates of transistors 3 and 6 as discussed above, and contact 32 allows for a contact to polysilicon structure 26. In particular, contact 32 allows for a contact to a portion of polysilicon structure 26 which may be wider than the remainder of polysilicon structure 26. Although polysilicon structure 26 has a wider portion, it is nonetheless considered to be substantially oblong. A polysilicon structure may be considered to be substantially oblong if the length of the polysilicon structure is greater than about three times the width of the polysilicon structure. Furthermore, a polysilicon structure may be considered to be substantially oblong despite having a substantially wider region if the wider region solely accommodates a contact region. Similarly, contact 33 is a shared contact which allows for contact to the drain of transistor 6 as well as polysilicon structure 27 and hence gates of transistors 2 and 5. Consequently, shared contacts 32 and 33 reduce the number of contacts needed by the subsequent local interconnect. Shared contacts such as 32 and 33 may be substantially rectangular.

Local interconnections are generally used for short runs relative to much longer metal conductors used for global connections. Thus, the term "local interconnect" may refer to the function of connecting features within a circuit, or it may refer to a distinct process layer that exclusively performs such short connections. Therefore, a process layer may perform local interconnecting functions, yet not be termed a "local interconnect layer." That is, a polysilicon layer may partially provide local interconnect in addition to providing transistor gates. The polysilicon layer may be configured such that multiple gates are connected, thus forming a local interconnect.

For example, polysilicon structures 26 and 27 provide local interconnect because they each form multiple gates. Polysilicon structure 26 is arranged above active region 23 and active region 24 to form gates of PMOS latch transistor 6 and NMOS latch transistor 3, respectively. Polysilicon structure 27 is arranged above active region 21 and active region 22 to form gates of NMOS latch transistor 2 and PMOS latch transistor 5, respectively. Therefore, polysilicon structures 26 and 27 each include two gates. Thus, polysilicon structures 26 and 27 may each perform a local interconnecting function because they each connect two separate gate conductors together. As a result, the subsequent local interconnect layer of the embodiment of FIG. 2 may be simplified because polysilicon structures 26 and 27 are performing a local interconnecting function that is frequently provided by a local interconnect layer. As will be discussed in more detail below, the embodiment of FIG. 2 utilizes an improved, simplified local interconnect layer layout as a result of the local interconnecting function provided by polysilicon structures 26 and 27.

Figure 3:
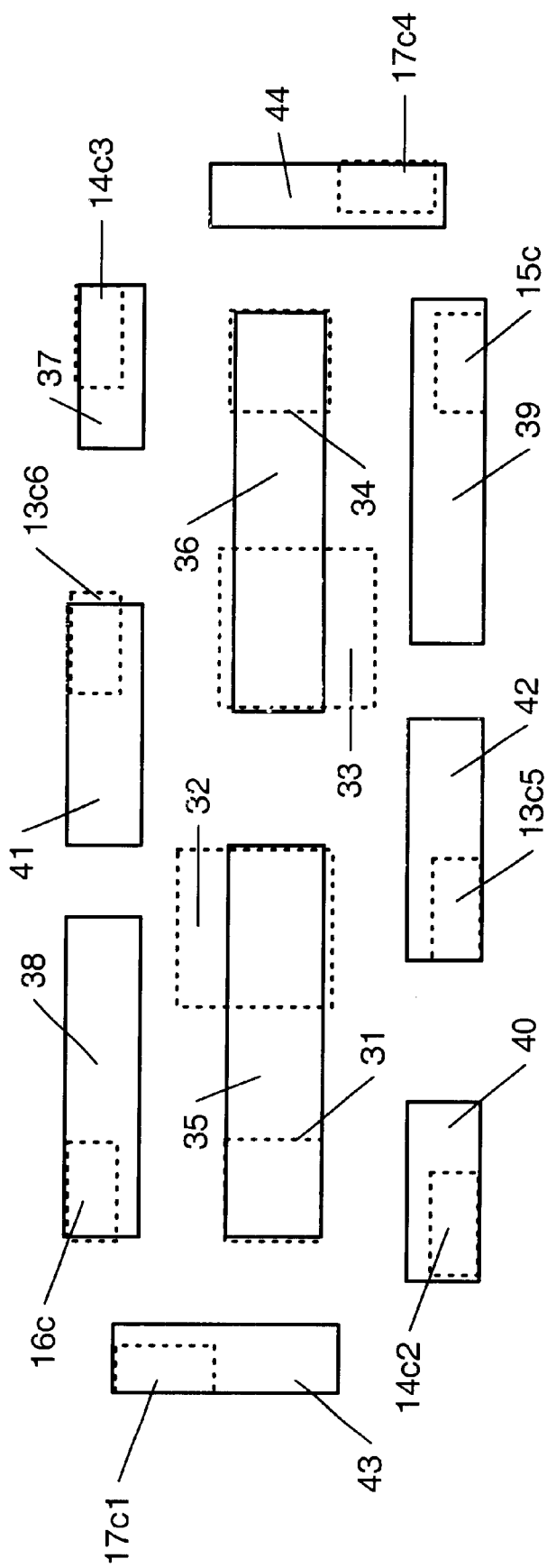
FIG. 3 represents a layout of the local interconnect for the regions and structures shown in FIG. 2.

FIG. 3 illustrates a local interconnect layer which may be used in conjunction with the layout shown in FIG. 2. Contacts 31–34 may be formed through a dielectric material arranged above the topography of the features shown in FIG. 2. The dielectric material is preferably deposited using physical vapor deposition (PVD), chemical vapor deposition (CVD), plasma enhanced chemical vapor deposition (PECVD), low pressure chemical vapor deposition (LPCVD), or spin on deposition techniques. In the vapor depositions, a silane or TEOS source, for example, may be used to produce the dielectric. In the spin on depositions, a liquid material of, for example, silicon (i.e., silicates, siloxanes, or silsesquioxanes) or TEOS may be spin-on deposited and subsequently cured. The dielectric material preferably has a thickness of approximately 6000–8000 angstroms, but other thicknesses may be suitable depending on the particular process used. Contacts 31–34 are also shown in FIG. 2. In the completed circuit, contacts 31 and 32 are connected to local interconnect region 35 which electrically connects the source of transistor 1 to the drains of transistors 2 and 5 and the gates of transistors 3 and 6 as shown in FIGS. 1 and 2. Thus, local interconnect region 35 completes the connections necessary to form node 11 as illustrated in FIG. 1. Similarly, local interconnect region 36 and contacts 33 and 34 will complete the connections necessary to form node 12 as illustrated in FIG. 1. It can be seen from FIG. 3 that local interconnect structures 35 and 36 are substantially rectangular and require connection to the structures of the previous layers in only two areas. This is an improvement over local interconnect structures which require multi-limbed, non-oblong interconnect structures and three connections to the structures of previous layers. The local interconnect of the embodiment of FIG. 3 is simplified as a result of the interconnect provided by the polysilicon structures 26 and 27.

In one embodiment of the local interconnect, the dielectric material is arranged upon the topography and planarized using, for example, chemical mechanical polishing, or "CMP." The dielectric is then etched to form contact openings 31–34. Next, an adhesion or "glue" layer may be formed by blanket depositing an adhesion material onto the sidewalls and bottom of openings 31–34. Suitable adhesion materials include titanium (Ti), titanium-tungsten (TiW), titanium nitride (TiN), or tungsten silicides (WSi$_x$). Adhesion layers may be used in those cases where conductive materials may adhere poorly to the dielectric material. Adhesion layers may be used, for example, to compensate for poor adhesion characteristics of tungsten and some tungsten alloys to silicon dioxide dielectric films. After an adhesion layer has been formed, a conductive material layer may then be deposited. In the case where tungsten, "W," is the conductive material deposited, this step is referred to as W plug. However, any suitable conducting material may be applied in a manner appropriate to the material. Next, the contact plugs are planarized such that they are substantially commensurate to an uppermost surface of the dielectric material. This planarization step may be accomplished via CMP. Next, an additional conducting layer is deposited. This conducting layer is commonly referred to as the local interconnect layer. The local interconnect layer may be made from a material having higher resistivity than the metals or conducting materials used for global interconnects. Suitable local interconnect materials may include polysilicon, doped polysilicon, refractory metal, silicide, or combinations of these. The local interconnect layer is subsequently patterned and etched, thus completing an embodiment of a local interconnect process flow.

In another local interconnect embodiment, the dielectric material is also arranged upon the topography and planarized. However, the dielectric is then etched to form trench openings that will suffice not only as contacts, but also as the local interconnects themselves. That is, a single trench etched through the dielectric opens up contact regions 31 and 32 as well as interconnect region 35 as shown in FIG. 3. Similarly, an additional trench may be etched into the dielectric for contact regions 33 and 34 as well as interconnect region 36. Other openings in the dielectric, such as Vss contact opening 14c3, may be also etched into the dielectric at this time. Next, an adhesion layer may be formed by blanket depositing an adhesion material onto the sidewalls and bottom of the trenches and contact openings. After the adhesion layer has been formed, a conductive material layer may then be deposited. This conductive material is planarized such that the uppermost surfaces of the trenches and contacts are substantially commensurate to an uppermost surface of the dielectric material. Again, this planarization step may be accomplished via CMP. At this point, the local interconnect layer process for the preferred embodiment is complete. Consequently, multiple processing steps are eliminated as compared to the above-described formation of local interconnects dielectrically spaced above the substrate. In particular, eliminated are the deposition of an additional conductive layer, the patterning of the additional conductive layer, and the etching of the additional conductive layer.

Returning to FIG. 3, in addition to local interconnect structures 35 and 36 and their respective contacts, other interconnect structures of interest are shown. Interconnect structures 38 and 39 correspond to bitlines "Bit" and "/Bit" and contacts 16c and 15c, respectively. It is noted that the contacts shown correspond to those shown in FIG. 2. Similarly, interconnect structures 37 and 40 correspond to Vss and contacts 14c3 and 14c2, respectively, while interconnect structures 41 and 42 correspond to Vcc and contacts 13c6 and 13c5, respectively. Following the interconnect layer, dielectric material may be arranged upon the interconnect layer, and contacts may subsequently be formed through this dielectric material. Another conducting layer, typically some type of metal, may be formed above the dielectric material and patterned and etched. This metal layer may be referred to as a first metal layer. Frequently, this metal layer contacts the bitlines, Vcc, and Vss globally across several memory cells. Yet another dielectric material may be arranged upon this first metal layer, and upon the dielectric material may be deposited a second metal layer. This second metal layer may be used as a global wordline. For example, interconnect structures 43 and 44 correspond to global wordline 17 and contacts 17c1 and 17c4.

It will be appreciated to those skilled in the art having the benefit of this disclosure that the embodiments described are believed applicable to semiconductor memories. Furthermore, although illustrated with reference to SRAMs, the system and method disclosed herein may be adapted to other types of memory devices. Accordingly, the specification and drawings are to be regarded in an illustrative rather than a restrictive sense as to possibly numerous architectures, circuitry, and methodologies which fall within the spirit and scope of the present invention.

What is claimed is:

1. A memory cell comprising a series of four substantially oblong active regions formed within a semiconductor substrate and arranged side-by-side with long axes substantially parallel, wherein each of the inner active regions of the series comprises a pair of source/drain regions for a respective p-channel transistor, and each of the outer active regions of the series comprises a pair of source/drain regions for a respective n-channel transistor.

2. The memory cell as recited in claim 1, further comprising a plurality of substantially oblong polysilicon structures arranged above and substantially perpendicular to the active regions.

3. The memory cell as recited in claim 1, wherein each active region comprises source/drain regions for no more than two transistors.

4. The memory cell as recited in claim 2, further comprising source/drain contacts to the source/drain regions of transistors, wherein at least one of the source/drain contacts comprises a shared contact to one of the inner active regions and one of the polysilicon structures.

5. The memory cell as recited in claim 4, further comprising a series of substantially oblong local interconnects arranged substantially perpendicular to the active regions, wherein the shared contact is connected to another of the source/drain contacts by one of the local interconnects.

6. The memory cell as recited in claim 5, wherein the local interconnects are dielectrically spaced above the semiconductor substrate.

7. The memory cell as recited in claim 5, wherein the local interconnects have an upper surface that is substantially coplanar with an upper surface of the source/drain contacts.

8. A memory cell comprising a plurality of substantially oblong active regions formed in a semiconductor substrate and arranged substantially in parallel with one another, and a plurality of substantially oblong local interconnects above said substrate that extend only partially across the memory cell and are arranged substantially in parallel with one another and substantially perpendicular to said active regions.

9. The memory cell as recited in 8, further comprising substantially square local interconnects above said substrate, wherein all local interconnects within the cell are either substantially oblong or substantially square.

10. The memory cell as recited in claim 8, further comprising a shared contact to one of the active regions and a polysilicon structure, wherein the polysilicon structure is arranged substantially perpendicular to said active region and a portion of the polysilicon structure abuts a portion of said active region.

* * * * *

(12) EX PARTE REEXAMINATION CERTIFICATE (10327th)
United States Patent
Jin

(10) Number: US 6,534,805 C1
(45) Certificate Issued: Oct. 14, 2014

(54) SRAM CELL DESIGN

(75) Inventor: Bo Jin, Campbell, CA (US)

(73) Assignee: Cypress Semiconductor Corporation, San Jose, CA (US)

Reexamination Request:
No. 90/011,833, Aug. 2, 2011

Reexamination Certificate for:
Patent No.: 6,534,805
Issued: Mar. 18, 2003
Appl. No.: 09/829,510
Filed: Apr. 9, 2001

(51) Int. Cl.
*H01L 27/10* (2006.01)

(52) U.S. Cl.
USPC ............ 257/206; 257/211; 257/369; 438/153

(58) Field of Classification Search
None
See application file for complete search history.

(56) References Cited

To view the complete listing of prior art documents cited during the proceeding for Reexamination Control Number 90/011,833, please refer to the USPTO's public Patent Application Information Retrieval (PAIR) system under the Display References tab.

*Primary Examiner* — Leonardo Andujar

(57) ABSTRACT

An embodiment of a memory cell includes a series of four substantially oblong parallel active regions, arranged side-by-side such that the inner active regions of the series include source/drain regions for p-channel transistors, and the outer active regions include source/drain regions for n-channel transistors. Another embodiment of the memory cell includes six transistors having gates substantially parallel to one another, where three of the gates are arranged along a first axis and the other three gates are arranged along a second axis parallel to the first axis. In another embodiment, the memory cell may include substantially oblong active regions arranged substantially in parallel with one another, with substantially oblong local interconnects arranged above and substantially perpendicular to the active regions. A method for fabricating a memory cell may include forming substantially oblong active regions within a semiconductor substrate, and forming substantially oblong local interconnects above and perpendicular to the active regions.

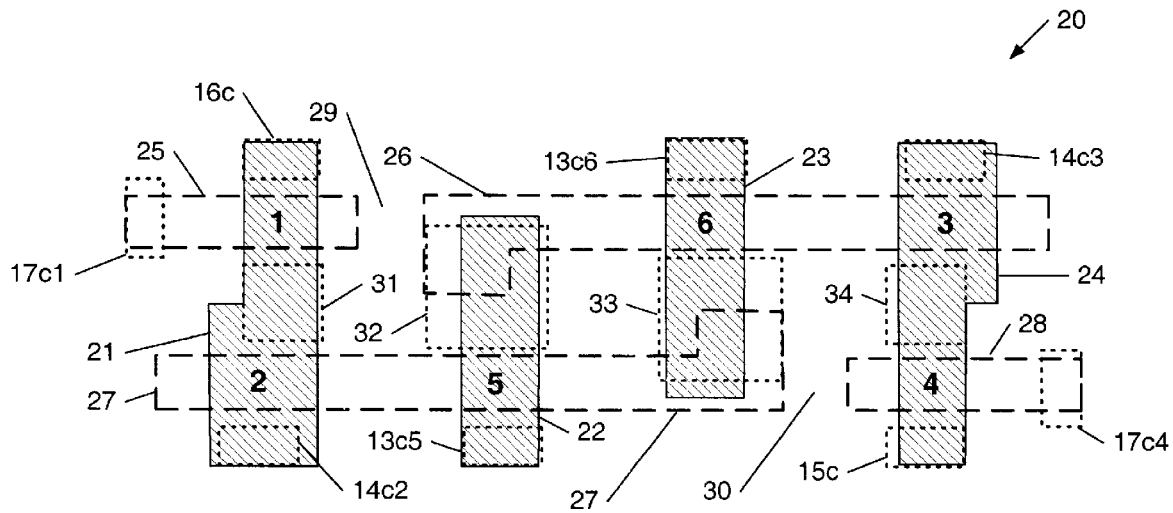

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-6 are cancelled.

Claim 8 is determined to be patentable as amended.

Claims 9-10, dependent on an amended claim, are determined to be patentable.

New claims 11-61 are added and determined to be patentable.

Claim 7 was not reexamined.

8. A memory cell comprising a plurality of substantially oblong active regions formed in a semiconductor substrate and arranged substantially in parallel with one another, and a plurality of substantially oblong local interconnects above said substrate that extend only partially across the memory cell and are arranged substantially in parallel with one another and substantially perpendicular to said active regions*; and*

*a single local interconnect layer comprising local interconnects corresponding to bitlines and a global wordline.*

*11. The memory cell of claim 8, wherein each local interconnect of the single local interconnect layer is substantially oblong.*

*12. The memory cell of claim 8, the single local interconnect layer comprising local interconnects corresponding to common power and common ground.*

*13. The memory cell of claim 12, wherein each local interconnect of the single local interconnect layer is substantially oblong.*

*14. The memory cell of claim 8, comprising:*
*a first contact to one of the substantially oblong active regions;*
*a shared contact to another one of the substantially oblong active regions and a polysilicon structure;*
*a first substantially oblong local interconnect that connects the first contact and the shared contact,*
*wherein the single local interconnect layer comprises the first substantially oblong local interconnect.*

*15. The memory cell of claim 8, comprising:*
*a first contact to one of the substantially oblong active regions;*
*a shared contact to another one of the substantially oblong active regions and a polysilicon structure;*
*a first substantially oblong local interconnect that connects the first contact and the shared contact,*
*wherein the first substantially oblong local interconnect is formed from a trench opening as a contact to one of the substantially oblong active regions.*

*16. A memory cell, comprising:*
*a series of four substantially oblong active regions formed within a semiconductor substrate and arranged side-by-side with long axes substantially parallel,*
*wherein each inner active region of the series comprises a pair of source/drain regions for a respective p-channel transistor, and*
*wherein each outer active region of the series comprises a pair of source/drain regions for a respective n-channel transistor; and*
*a single local interconnect layer comprising local interconnects corresponding to bitlines and a global wordline.*

*17. The memory cell of claim 16, wherein each local interconnect of the single local interconnect layer is substantially oblong.*

*18. The memory cell of claim 16, the single local interconnect layer comprising local interconnects corresponding to common power and common ground.*

*19. The memory cell of claim 18, wherein each local interconnect of the single local interconnect layer is substantially oblong.*

*20. The memory cell of claim 16, comprising:*
*a first contact to one of the outer active regions;*
*a shared contact to one of the inner active regions and a polysilicon structure;*
*a first substantially oblong local interconnect that connects the first contact and the shared contact,*
*wherein the single local interconnect layer comprises the first substantially oblong local interconnect.*

*21. The memory cell of claim 16, comprising:*
*a first contact to one of the outer active regions;*
*a shared contact to one of the inner active regions and a polysilicon structure;*
*a first substantially oblong local interconnect that connects the first contact and the shared contact,*
*wherein the first substantially oblong local interconnect is formed from a trench opening as a contact to one of the active regions.*

*22. The memory cell of claim 16, comprising:*
*a plurality of substantially oblong polysilicon structures arranged above and substantially perpendicular to the active regions.*

*23. The memory cell of claim 16, comprising:*
*source/drain contacts to the source/drain regions of transistors,*
*wherein at least one of the source/drain contacts comprises a shared contact to one of the inner active regions and one of the polysilicon structures.*

*24. The memory cell of claim 23, comprising:*
*a series of substantially oblong local interconnects arranged substantially perpendicular to the active regions,*
*wherein the shared contact is connected to another of the source/drain contacts by one of the substantially oblong local interconnects.*

*25. The memory cell of claim 24, wherein the substantially oblong local interconnects are dielectrically spaced above the semiconductor substrate.*

*26. The memory cell of claim 24, wherein the substantially oblong local interconnects have an upper surface that is substantially coplanar with an upper surface of the source/drain contacts.*

*27. A memory cell, comprising:*
*a series of four substantially oblong active regions formed within a semiconductor substrate and arranged side-by-side with long axes substantially parallel,*
*wherein each inner active region of the series comprises a pair of source/drain regions for a respective p-channel transistor, and* wherein each outer active region of the series comprises a pair of source/drain regions for a respective n-channel transistor;

a first contact to one of the outer active regions;

a shared contact to both a polysilicon structure and to one of the inner active regions; and a substantially oblong local interconnect that connects the first contact and the shared contact, wherein the substantially oblong local interconnect overlaps both the polysilicon structure and said one of the inner active regions.

28. The memory cell of claim 27, wherein the substantially oblong local interconnect is dielectrically spaced above the semiconductor substrate.

29. A memory cell, comprising:

a series of four substantially oblong active regions formed within a semiconductor substrate and arranged side-by-side with long axes substantially parallel, wherein each inner active region of the series comprises a pair of source/drain regions for a respective p-channel transistor, and wherein each outer active region of the series comprises a pair of source/drain regions for a respective n-channel transistor;

a first contact to one of the outer active regions;

source/drain contacts to the source/drain regions of transistors, wherein at least one of the source/drain contacts comprises a shared contact to both a polysilicon structure and to one of the inner active regions; and a substantially oblong local interconnect that connects the first contact and the shared contact, wherein the substantially oblong local interconnect overlaps both the polysilicon structure and said one of the inner active regions, and wherein the substantially oblong local interconnect has an upper surface that is substantially coplanar with an upper surface of the source/drain contacts.

30. A memory cell, comprising:

a plurality of substantially oblong active regions formed in a semiconductor substrate and arranged substantially in parallel with one another;

a plurality of substantially oblong local interconnects above said substrate that extend partially across the memory cell and are arranged substantially in parallel with one another and substantially perpendicular to the active regions;

a first contact to one of the active regions;

a shared contact to both a polysilicon structure and to another one of the active regions; and a substantially oblong local interconnect that connects the first contact and the shared contact, wherein the substantially oblong local interconnect overlaps both the polysilicon structure and said another one of the active regions.

31. The memory cell of claim 30, comprising:

substantially square local interconnects above the substrate, wherein local interconnects within the cell are one of substantially oblong and substantially square.

32. The memory cell of claim 30, wherein the polysilicon structure is arranged substantially perpendicular to said another one of the active regions, and wherein a portion of the polysilicon structure abuts a portion of the said another one of the active regions.

33. A memory cell, comprising:

a series of four substantially oblong active regions formed within a semiconductor substrate and arranged side-by-side with long axes substantially parallel, wherein each inner active region of the series comprises a pair of source/drain regions for a respective p-channel transistor, wherein each outer active region of the series comprises a pair of source/drain regions for a respective n-channel transistor, and wherein a width varies along a length of each of the active regions.

34. The memory cell of claim 33, wherein the length varies along the width of each of the active regions.

35. The memory cell of claim 33, comprising:

a plurality of substantially oblong polysilicon structures arranged above and substantially perpendicular to the active regions.

36. The memory cell of claim 35, comprising:

source/drain contacts to the source/drain regions of transistors, wherein at least one of the source/drain contacts comprises a shared contact to one of the inner active regions and one of the polysilicon structures.

37. The memory cell of claim 36, comprising:

a series of substantially oblong local interconnects arranged substantially perpendicular to the active regions, wherein the shared contact is connected to another of the source/drain contacts by one of the local interconnects.

38. The memory cell of claim 37, wherein the local interconnects are dielectrically spaced above the semiconductor substrate.

39. The memory cell of claim 37, wherein the substantially oblong local interconnects have an upper surface that is substantially coplanar with an upper surface of the source/drain contacts.

40. A memory cell, comprising:

a series of four substantially oblong active regions formed within a semiconductor substrate and arranged side-by-side with long axes substantially parallel, wherein each inner active region of the arrangement comprises a pair of source/drain regions for a respective p-channel transistor, wherein each outer active region of the arrangement comprises a pair of source/drain regions for a respective n-channel transistor, and wherein a width varies along at least a portion of a length and the length varies along at least a portion of the width of each of the four substantially oblong active regions.

41. The memory cell of claim 40, comprising:

a plurality of substantially oblong polysilicon structures arranged above and substantially perpendicular to the active regions.

42. The memory cell of claim 41, comprising:

source/drain contacts to the source/drain regions of transistors, wherein at least one of the source/drain contacts comprises a shared contact to one of the inner active regions and one of the polysilicon structures.

43. The memory cell of claim 42, comprising:

a series of substantially oblong local interconnects arranged substantially perpendicular to the active regions, wherein the shared contact is connected to another of the source/drain contacts by one of the local interconnects.

44. The memory cell of claim 43, wherein the local interconnects are dielectrically spaced above the semiconductor substrate.

45. The memory cell of claim 43, wherein the substantially oblong local interconnects have an upper surface that is substantially coplanar with an upper surface of the source/drain contacts.

46. A memory cell, comprising
a series of four substantially oblong active regions formed in a semiconductor substrate and arranged substantially in parallel with one another,
wherein a width varies along a length of each of the active regions; and
a plurality of substantially oblong local interconnects that above the substrate and extend partially across the memory cell and are arranged substantially in parallel with one another and substantially perpendicular to the active regions.

47. The memory cell of claim 46, wherein the length varies along the width of each of the active regions.

48. The memory cell of claim 46, comprising:
substantially square local interconnects above the substrate,
wherein all local interconnects within the cell are either substantially oblong or substantially square.

49. The memory cell of claim 46, comprising:
a shared contact to one of the active regions and a polysilicon structure,
wherein the polysilicon structure is arranged substantially perpendicular to the active region, and
wherein a portion of the polysilicon structure abuts a portion of the active region.

50. A memory cell, comprising:
a series of four substantially oblong active regions formed in a semiconductor substrate and arranged substantially in parallel with one another,
wherein a width varies along at least a portion of a length and the length varies along at least a portion of the width of each of the plurality of active regions; and
a plurality of substantially oblong local interconnects above the substrate that extend partially across the memory cell and are arranged substantially in parallel with one another and substantially perpendicular to the active regions.

51. The memory cell of claim 50, comprising:
substantially square local interconnects above the substrate,
wherein local interconnects within the cell are one of substantially oblong and substantially square.

52. The memory cell of claim 50, comprising:
a shared contact to one of the active regions and a polysilicon structure,
wherein the polysilicon structure is arranged substantially perpendicular to the active region, and
wherein a portion of the polysilicon structure abuts a portion of the active region.

53. A memory cell, comprising:
a series of four substantially oblong active regions formed within a semiconductor substrate and arranged side-by-side with long axes substantially parallel,
wherein each inner active region of the series comprises a pair of source/drain regions for a respective p-channel transistor, and
wherein each outer active region of the series comprises a pair of source/drain regions for a respective n-channel transistor;
a first metal layer above the semiconductor substrate,
wherein the first metal layer contacts bitlines, common power, and common ground globally across a plurality of memory cells; and
a second metal layer above the first metal layer,
wherein the second metal layer is configured as a global wordline.

54. The memory cell of claim 53, comprising:
a plurality of substantially oblong polysilicon structures arranged above and substantially perpendicular to the active regions.

55. The memory cell of claim 54, comprising:
source/drain contacts to the source/drain regions of transistors,
wherein at least one of the source/drain contacts comprises a shared contact to one of the inner active regions and one of the polysilicon structures.

56. The memory cell of claim 55, comprising:
a series of substantially oblong local interconnects arranged substantially perpendicular to the active regions,
wherein the shared contact is connected to another of the source/drain contacts by one of the local interconnects.

57. The memory cell of claim 56, wherein the local interconnects are dielectrically spaced above the semiconductor substrate.

58. The memory cell of claim 56, wherein the substantially oblong local interconnects have an upper surface that is substantially coplanar with an upper surface of the source/drain contacts.

59. A memory cell, comprising:
a plurality of substantially oblong active regions formed in a semiconductor substrate and arranged substantially in parallel with one another;
a plurality of substantially oblong local interconnects above the substrate and extending partially across the memory cell and are arranged substantially in parallel with one another and substantially perpendicular to the active regions;
a first metal layer above the semiconductor substrate,
wherein the first metal layer contacts bitlines, common power, and common ground globally across a plurality of memory cells; and
a second metal layer above the first metal layer,
wherein the second metal layer is configured as a global wordline.

60. The memory cell of claim 59, comprising:
substantially square local interconnects above the substrate,
wherein local interconnects within the cell are one of substantially oblong and substantially square.

61. The memory cell of claim 59, comprising:
a shared contact to one of the active regions and a polysilicon structure,
wherein the polysilicon structure is arranged substantially perpendicular to the active region, and
wherein a portion of the polysilicon structure abuts a portion of the active region.

* * * * *